United States Patent
Chen et al.

(10) Patent No.: US 7,629,607 B2
(45) Date of Patent: Dec. 8, 2009

(54) ORGANIC NON-VOLATILE MEMORY MATERIAL AND MEMORY DEVICE UTILIZING THE SAME

(75) Inventors: Jun-Rong Chen, Taoyuan County (TW); Heng-Tien Lin, Taoyuan County (TW); Jui-Fen Fan, Hsinchu County (TW); Gue-Wuu Hwang, Kaohsiung (TW); Ching Ting, Hsinchu (TW); Yi-Jen Chan, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 222 days.

(21) Appl. No.: 11/877,853

(22) Filed: Oct. 24, 2007

(65) Prior Publication Data

US 2008/0277651 A1 Nov. 13, 2008

(30) Foreign Application Priority Data

May 9, 2007 (TW) .............................. 96116457 A

(51) Int. Cl.
*G11C 11/00* (2006.01)
(52) U.S. Cl. ................. 257/40; 257/E51.008
(58) Field of Classification Search .................. 257/40, 257/E51.008
See application file for complete search history.

(56) References Cited

U.S. PATENT DOCUMENTS

| 2004/0027849 | A1 | 2/2004 | Yang et al. |
| 2005/0058009 | A1* | 3/2005 | Yang et al. ................. 365/232 |
| 2005/0211978 | A1 | 9/2005 | Bu et al. |
| 2006/0141703 | A1 | 6/2006 | Kang et al. |

* cited by examiner

*Primary Examiner*—Thomas L Dickey
(74) *Attorney, Agent, or Firm*—Thomas, Kayden, Horstemeyer & Risley

(57) ABSTRACT

Disclosed is an organic non-volatile memory (ONVM) material including nanoparticles evenly dispersed in a first polymer. The nanoparticles have a metal core covered by a second polymer to form a core/shell structure, and the first polymer has a higher polymerization degree and molecular weight than the second polymer. The ONVM material of the invention has high uniformity, thereby stabilizing the electric properties of the memory device, such as increasing rewrite counts, increasing data retention time, reducing driving voltage, reducing write current, and enhancing current on/off ratio.

12 Claims, 5 Drawing Sheets

ORGANIC NON-VOLATILE MEMORY MATERIAL AND MEMORY DEVICE UTILIZING THE SAME

BACKGROUND OF THE INVENTION

1. Field of the Invention

The invention relates to a memory device, and in particular to an organic non-volatile material in the active layer of the memory device.

2. Description of the Related Art

With the semiconductor industry moving toward nano-scale technology, manufacturing requirements no longer focus only on lighter weights, or thinner, shorter and smaller sizes. Moving forward, focus is also being placed on multi-function ability, mobility, multi-media ability, and network ability. Additionally, focus is also being placed on design and other customer requirements. Organic semiconductor material has benefits such as a lighter weight, lower costs, and potential for mainstream use in the future. For current organic semiconductor material, use is applied in a wide field with lower costs.

For achieving described requirements, Japanese corporations such as Rohm, NEC, Toshiba, Fujitsu, Hitachi, Matsushita have developed ferro random access memory (FeRAM). Meanwhile, IBM, Infineon, Motorola, Samsung, Toshiba, NEC, and Sony have developed magnetoresistive random access memory (MRAM). Also, Intel and ST Microelectronics have developed ovonic unified memory (OUM). Currently, the three memories are mainstream non-volatile memory (NVM) used in electronic devices. NVM may retain storage data for a hard disk and applications. For example, NVM can be applied in communication devices, computer devices, household electrical devices, and radiofrequency identification (RFID) tags. With the trend for electronic devices moving toward low energy consumption, NVM will likely increase importance in application usage.

Meanwhile, erasable programmable read only memory (EPROM), electrically erasable programmable read-only memory (EEPROM), and flash memory technologies have been shrinking sizes of the devices toward nano-scale levels. However, due to the maturity of FeRAM and MRAM technologies reaching physical and lower cost limitations, an alternative replacement such as organic NVM (ONVM) is conceived by combining flexible electronics and NVM. For an ONVM, an organic material serves as an active layer of the NVM device. An ONVM may integrate organic materials into flexible electronics, thereby comprising a one current direction of the flexible electronic.

A major mechanism of the ONVM is a bi-stable effect, and the ONVM is an organic bi-stable diode device (OBD). For an OBD, the organic material used has low conductivity. For the device, "reading" is processed by lower voltage, and a low current signal is obtained and defined as "0". If a higher voltage is applied, the nanoparticles mixed in the organic material would charge and become charged carriers, such that the active layer would change to have high conductivity. The voltage applying process is a so-called "write". Note that when the applying voltage is removed, the charged carriers are stable due to memory effect. With subsequent "reading" processed by lower voltage, a high current signal is obtained and defined as "1". The charges carried by the nanoparticles can be discharged by applying a reverse voltage, such that the active layer is converted to low conductivity. This reverse voltage applying process is a so-called "erase". Utilizing the high and low conductivity statuses, the circle of write, read, and erase completes the methodology for memory devices.

When applied in flexible electronics, ONVM material can withstand a wet process. The ONVM is not only used in a flexible electronic carrier of the RFID, but also in all electronic devices with a memory unit to store data. The relatively more inexpensive ONVM materials may replace current NVM materials due to cost.

In U.S. Pub. No. 2004/0027849, the memory mechanism utilizes semiconductor molecules combined with metal carrier traps. It has advantages such as low driving voltage and utilization of a wet process, however, '849 still fails to prevent metal particles aggregation.

In U.S. Pub. No. 2006/0141703, Samsung provides a method for metal particles to be evenly dispersed in the active layer. This method utilizing mesoporous materials and multi-layered coating, requires a complicated process and expensive material costs.

In U.S. Pub. No. 2005/0211978, metal particles, semiconductor materials, and polymer are coupled to form a single material. In this method, the metal particles are partially grafted to the polymer chain and is not covered by the polymer.

Thus an ONVM, in which the conductive particles can be evenly dispersed in organic materials and serve as an active layer of the device is called for to improve device yield and electric properties such as retention time and endurance.

SUMMARY OF THE INVENTION

The invention provides an organic non-volatile memory material, comprising a first polymer, and nanoparticles having a metal core covered by a second polymer to form a core/shell structure, wherein the first and second polymer are polymerized by a same monomer, and the nanoparticles are evenly dispersed in the first polymer.

The invention also provides a memory device, comprising a power supply electrically connecting to a first electrode, a ground wire electrically connecting to a second electrode, and an active layer disposed between the first and second electrodes, wherein the active layer is the described organic non-volatile memory material.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
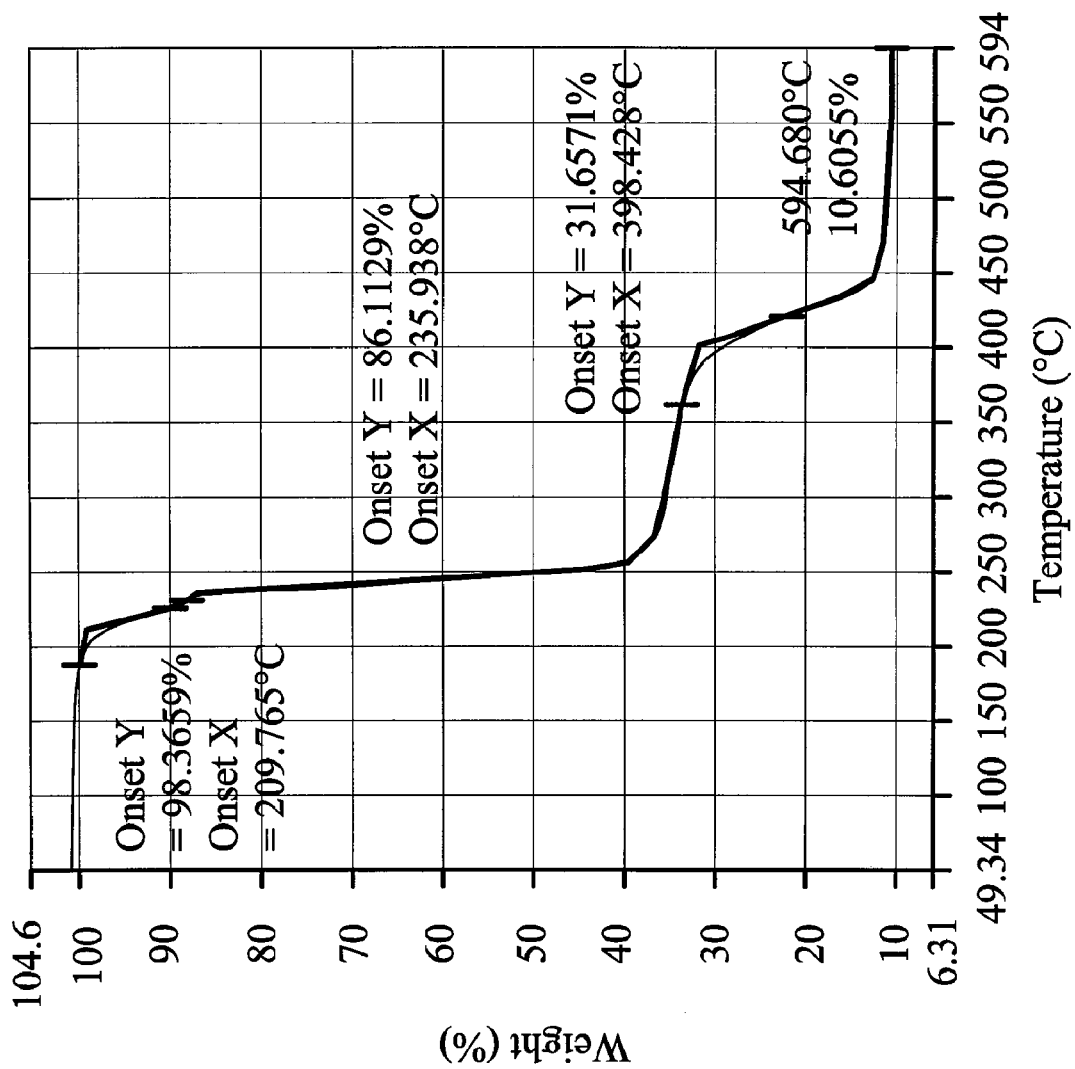
FIG. 1 is a schematic view showing the pyrolysis curve in Example 3 of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides an organic non-volatile memory material, comprising a first polymer and nanoparticles having a metal core covered by a second polymer to form a core/shell structure. The first and second polymers are polymerized by a same monomer, and the nanoparticles are evenly dispersed in the first polymer.

The first polymer is a so-called host polymer. Because the first and second polymer have similar structures, such that the nanoparticles can be evenly dispersed in the first polymer to prevent phase separation. In one embodiment, the metal core of the nanoparticles and the first polymer have a weight ratio of less than 3:1. In another embodiment, the metal core of the nanoparticles and the first polymer have a weight ratio of less than 0.5:1.

In one embodiment of the invention, the functional terminal end group of the second polymer (shell) includes carboxylic acid, a sulfur-containing group, or a nitrogen-containing group for immobilizing the second polymer on the surface of the metal core. Suitable sulfur-containing groups can be trithiocarbonate, thiol, sulfonyl, or other sulfur-containing groups. Suitable nitrogen-containing groups can be amino, amido, or other nitrogen-containing groups. The functional terminal end group is selected corresponding to the metal core. If metal core is gold, the functional terminal end group can be a sulfur-containing group. If metal core is iron, cobalt, nickel, copper, ruthenium, rhodium, palladium, silver, rhenium, osmium, iridium, platinum, or oxides thereof, the functional terminal end group can be a carboxylic acid, sulfur-containing group, or nitrogen-containing group. After connecting the second polymer to the metal core surface to form the shell of the nanoparticles, the nanoparticles are dispersed in the first polymer (host polymer) to form the ONVM. In one embodiment of the invention, the nanoparticles have a size of about 1 nm to 100 nm. In another embodiment of the invention, the nanoparticles have a size of about 1 nm to 20 nm.

In one embodiment of the invention, the polymer is synthesized by reversible addition-fragmentation chain transfer (RAFT) to control the molecular weight and have a sulfur-containing group as its functional terminal end group. The RAFT mechanism is shown below:

the substituent Z. Those skilled in the art may determine the polymerization degree and the molecular weight by the Z type.

In general, the described thermal initiator is a thermal initiator, but a photo initiator is optional. The thermal initiator can be an azo compound such as 2,2'-azobis(2,4-dimethyl valeronitrile), dimethyl 2,2'-azobis(2-methylpropionate), 2,2-azobisisobutyronitrile (hereinafter AIBN), 2,2-azobis(2-methylisobutyronitrile), 1,1'-azobis(cyclohexane-1-carbonitrile), 2,2'-azobis[N-(2-prophenyl)-2-methylpropionamide], 1-[(cyano-1-methylethyl)azo]formamide, 2,2'-azobis(N-butyl-2-methyl propionamide), 2,2'-azobis(N-cyclohexyl-2-methylpropionamide), or other suitable azo compounds. The thermal initiator also includes peroxides such as benzoyl peroxide, 1,1-bis(tert-butylperoxyl)cyclohexane, 2,5-bis(tert-butylperoxy)-2,5-dimethylcyclohexane, 2,5-bis(tert-butylperoxy)-2,5-dimethyl-3-cyclohexyne, bis(1-tert-butylperoxy)-1-methyl-ethyl)benzene, tert-butyl hydroperoxide, tert-butyl peroxide, tert-butyl perperoxybenzoate, cumene hydroperoxide, cyclohexanone peroxide, dicumyl peroxide, lauroyl peroxide, or other suitable peroxides. The described thermal initiator can be used individually or collectively if necessary. The photo initiator includes acetophenones such as 2-methyl-1-(4-(methylthio)phenyl)-2-morpholino-propane, 1-hydroxycyclohexyl phenyl ketone, diethoxyacetophenone, 2-hydroxy-2-methyl-1-phenyl-propane-1-one, 2-benzyl-2-(dimethylamino)-1-[4-(morpholinyl)phenyl]-1-butanone, or other suitable acetophenones. The photo initiator also includes benzoins such as benzoin methyl ether, benzyl dimethyl ketal, or other suitable benzoins. The photo initiator further includes benzophenones such as 4-phenyl benzophenone, hydroxylbenzohenone, or other suitable benzophenones. The photo initiator includes thioxanthones such as isopropyl thioxanthone, 2-chlorothioxanthone, or other suitable thioxanthones. The photo initiator also includes anthraquinones such as 2-ethylanthraquinone, or the likes.

After polymerization of the described monomer, the polymer may form a film. The polymer can be poly(2-methyl-acrylic acid 1-adamantan-1-methyl-1-methyl-ethyl ester) (PCm), poly methylmethacrylate (PMMA), polypropylene

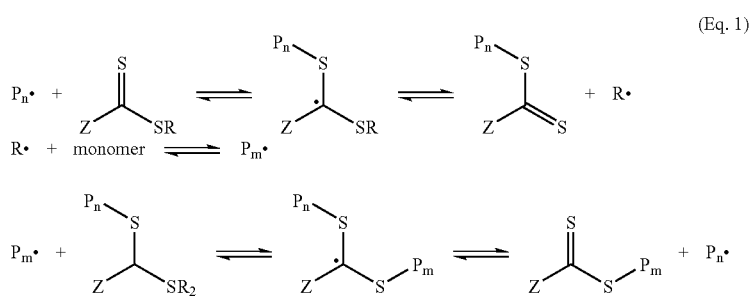

(Eq. 1)

In Eq. 1, a polymer chain ($P_n\bullet$) is initiated with a thermal or photo initiator to polymerize monomers. $P_n\bullet$ further reacts with the thioester S=C(Z)—S—R to release radical R•. R• polymerizes with other monomers to form another polymer ($P_m\bullet$). $P_m\bullet$ may react with the thioester S=C(Z)—S—$P_n$ to release the polymer $P_n\bullet$. The released $P_n\bullet$ can react with the residue monomers. The described mechanism is a so-called RAFT classified to living-radical polymerization. The polymer molecular weight is efficiently controlled by choosing (PP), polycarbonate (PC), polyethylene (PE), polystyrene (PS), poly(ethylene terephthalate) (PET), or the likes. If the shell of the nanoparticles (second polymer) and the host polymer (first polymer) adopt Cm as monomer, the ONVM will have better thermal stability. If the shell of the nanoparticles and the host polymer have the same monomer, however, the host polymer has a numeral molecular weight ($M_n$=10000-30000 g/mol) much greater than the shell of the nanoparticles ($M_n$=1000-10000 g/mol) in one embodiment. The nanoparticles covered by low $M_n$ polymer have smaller size and better disperse ability, with bi-stable yield greater than 90%. In addition, formation of film of the host polymer with high $M_n$ is easier, thereby efficiently controlling the active layer thickness. Therefore, the turned-on current can be reduced to less than 1 mA, and the device is erased and rewritten by applied low voltage.

The invention also provides a memory device, comprising a power supply electrically connecting to a first electrode, a ground wire electrically connecting to a second electrode, and an active layer disposed between the first and second electrodes. The active layer is the described ONVM. In one embodiment, the active layer has a thickness less than 2000 nm. In another embodiment, the active layer has a thickness less than 200 nm. Because the read/write/erase is performed by direct charge transfer between the electrode and the nanoparticles, extra electron donors are omitted. The pulse potential is less than potential cycling when data is erased by a reverse voltage, such that the device has prolonged endurance and is not damaged easily.

EXAMPLES

Example 1

Synthesis PCm with Low Molecular Weight ($M_n$<10000 g/mol)

2 g of Cm, 0.055 g of AIBN, 0.128 g of trithiocarbonic acid cyano-dimethyl-methyl ester methyl ester (trithioester), and 1.5 g of toluene were charged in a high pressure reactor, frizzed-pumped-thawed three times to remove the oxygen in the reactants, and then reacted at 90° C. for 20 hours. The result was diluted and dissolved by adding THF, and then added a great deal of pentane to precipitate a solid. The solvent was then removed, and the solid was dissolved by THF and then added pentane to precipitate again. After removing the solvent, the white solid (1.7 g) was obtained by vacuum drying. The $M_w$ (2399 g/mol), $M_n$ (2084 g/mol), and polymer distribution index (PDI, 1.15) of the white solid was measured by gel permeable chromatography (GPC). The polymerization is shown in Eq. 2.

-continued

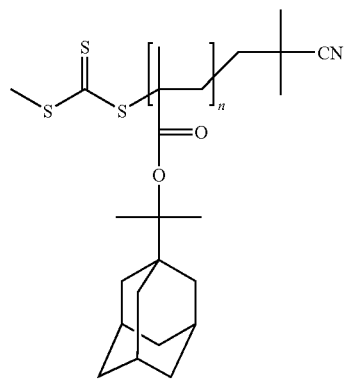

Example 2

Synthesis PCm with High Molecular Weight ($M_n$>10000 g/mol)

2 g of PCm ($M_w$=55770), 0.036 g of AIBN, 2.4 g of Cm, 0.128 g of trithioester, and 1.5 g of toluene were charged in a high pressure reactor, frizzed-pumped-thawed three times to remove the oxygen in the reactants, and then reacted at 80° C. for 20 hours. The result was diluted and dissolved by adding THF, and then added a great deal of pentane to precipitate a solid. The solvent was then removed, and the solid was dissolved by THF and then added pentane to precipitate again. After removing the solvent, the white solid (4 g) was obtained by vacuum drying. The $M_w$ (112266 g/mol), $M_n$ (81917 g/mol), and PDI (1.36) of the white solid were measured by gel permeable chromatography (GPC). The polymerization is shown in Eq. 3.

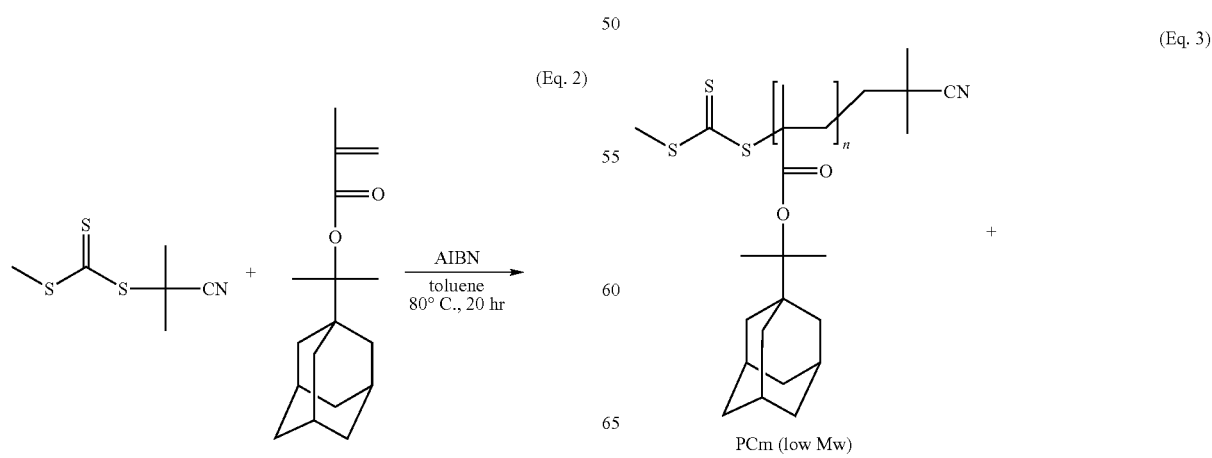

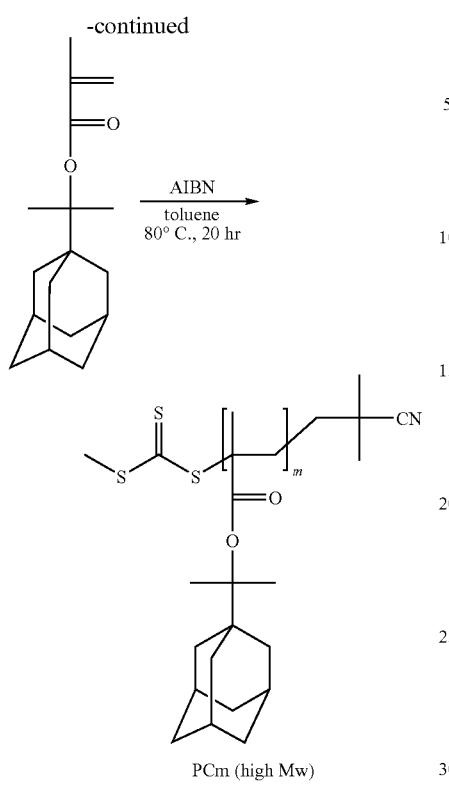

PCm (high Mw)

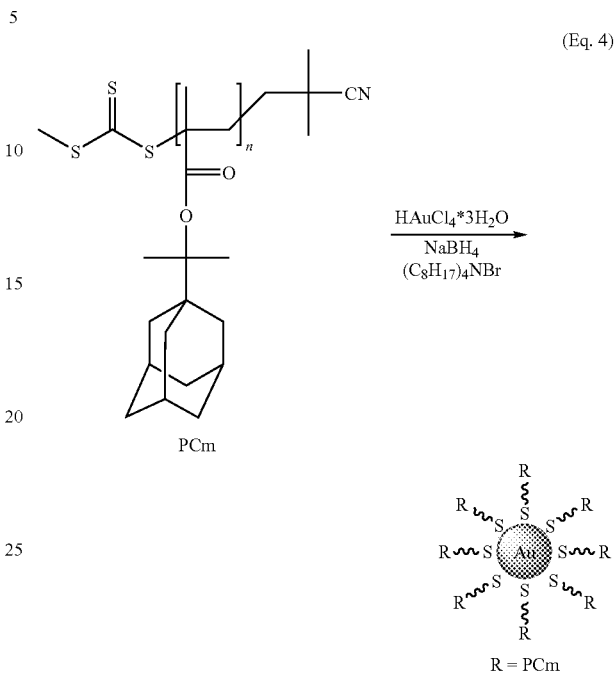

(Eq. 4)

PCm

R = PCm

Example 3

Synthesis Au—PCm Nano Articles (1) 0.1 g (0.26 mmol) of chloroauric acid (HAuCl$_4$.3H$_2$O) was dissolved in 8 mL of deionized water.

(2) 0.5 g of phase transfer agent tetraoctylamonnium bromide was dissolved in 15 mL of toluene.

(3) The solutions of step (1) and step (2) were charged in a reaction flask and violently stirred for 10 minutes. The water phase was removed and the organic phase was retained. Note that the removed water phase should be transparent. If the water phase is opaque, more toluene should be added by stirring.

(4) 1 g of product in Example 1 was dissolved in 10 mL toluene, added to the organic phase in step (3), and then violently stirred for 5 hours.

(5) 0.12 g (3.12 mmol) of reductant sodium boronhydride (NaBH$_4$) was dissolved in 10 mL of deionized water, added to the mixture in step (4), and then violently stirred for 3 hours. In this step, some bubbles were observed and the upper layered organic phase changed to purple.

(6) After step (5), the upper layered organic phase was extracted and distillated in vacuum to remove most of the solvent.

(7) The crude from step (6) was added to dry methanol to obtain a suspension.

(8) The suspension was centrifugalized at 300 rpm for 15 minutes to obtain the Au—PCm nanoparticles.

(9) The steps (7) and (8) were performed by alternately deionizing water/dry methanol by three times to wash Au—Pcm, such that the unreacted salt and reactants were removed.

(10) The resulting Au—PCm from step (9) were dried to obtain a brown solid (0.8 g). The described reaction is shown in Eq. 4.

Example 4

Synthesis Au—PCm Nanoparticles

Similar to Example 3, the difference is PCm in step (4) is the high molecular weight PCm produced in Example 2.

Example 5

Size Analysis of Au—PCm

Au—PCm of Examples 3 and 4 were charged in toluene to form 0.01 wt % suspension, respectively. The suspension was dipped on a copper grid, baked in vacuum to remove toluene, and analyzed by TEM (H-750, Hitachi). The nanoparticles of Example 3 have a size of 4 nm to 6 nm with excellent uniformity. The nanoparticles of Example 4 have a size of 5 nm to 12 nm with poor uniformity.

Example 6

Thermal Analysis of Au—PCm

Figure 2:
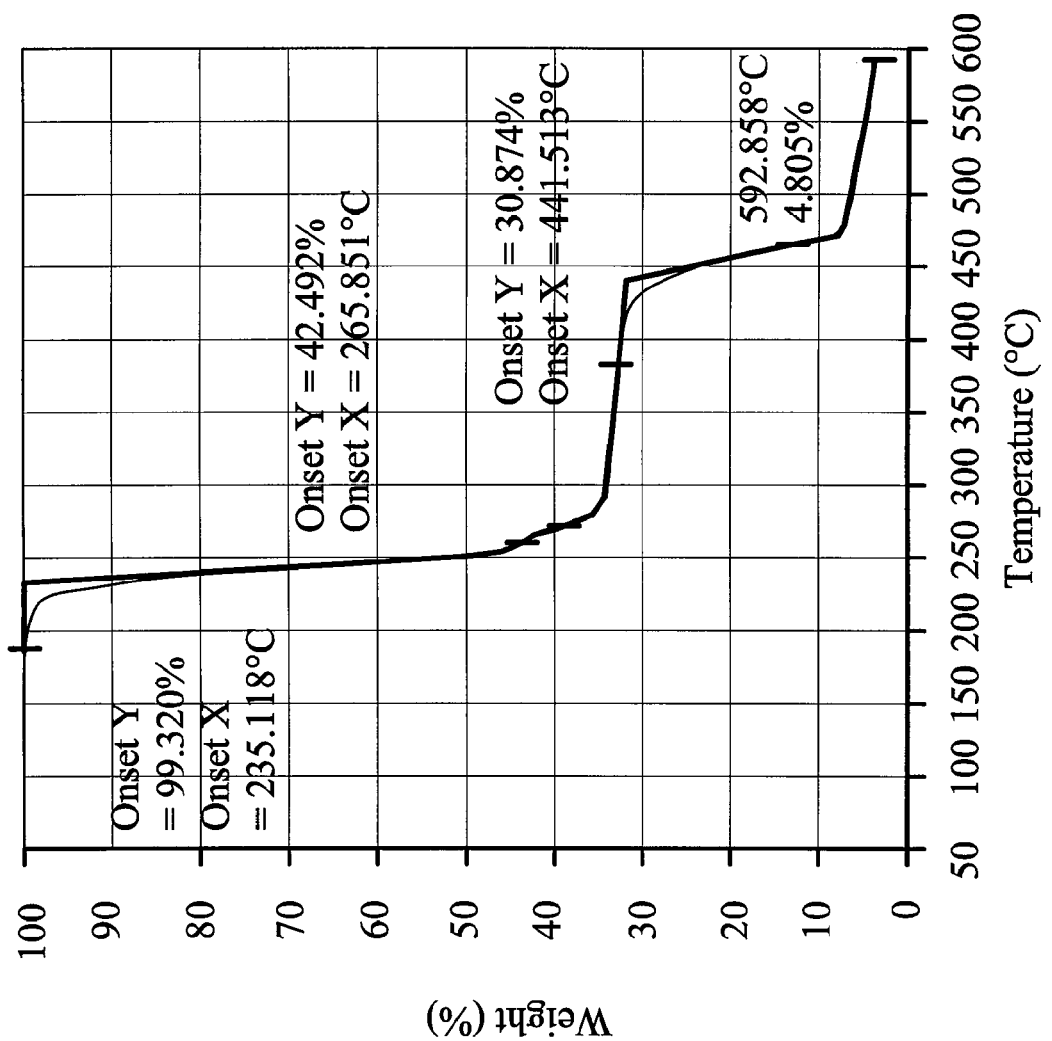
FIG. 2 is a schematic view showing the pyrolysis curve in Example 4 of the invention.

Au—PCm of Examples 3 and 4 were charged in a vacuum oven to remove moisture, the dried samples were about 5 mg to 10 mg. The dried samples were charged on platinum plates, heated at rate of 20° C./min under dry nitrogen to analyze the weight loss between 50° C. to 600° C. by thermal gravity analyzer (PERKIN ELMER TGA-4). After combustion, the residue gilt solid was indestructible metal gold. The nanoparticles of Example 3 were pyrolyzed at 210 to 398° C. with two-step pyrolysis, and the residue gold was about 10 wt % of the nanoparticles. The nanoparticles of Example 4 were pyrolyzed at 235 to 441° C., and the residue gold was about 5 wt % of the nanoparticles. FIGS. 1 and 2 show the pyrolysis curves of nanoparticles in Examples 3 and 4, respectively.

Example 7

Synthesis PMMA with Low Molecular Weight ($M_n$ < 10000 g/mol)

2 g of methyl methacrylate (MMA), 0.132 g of AIBN, 0.3056 g of trithioester, and 6 g of toluene were charged in a high pressure reactor, frizzed-pumped-thawed three times to remove the oxygen in the reactants, and then reacted at 80° C. for 20 hours. The result was diluted and dissolved by adding THF, and then added a great deal of pentane to precipitate a solid. The solvent was then removed, and the solid was dissolved by THF and then added pentane to precipitate again. After removing the solvent, the white solid (7.3 g) was obtained by vacuum drying. The $M_w$ (6400 g/mol), $M_n$ (5144 g/mol), and PDI (1.24) of the white solid was measured by gel permeable chromatography (GPC). The polymerization is shown in Eq. 5.

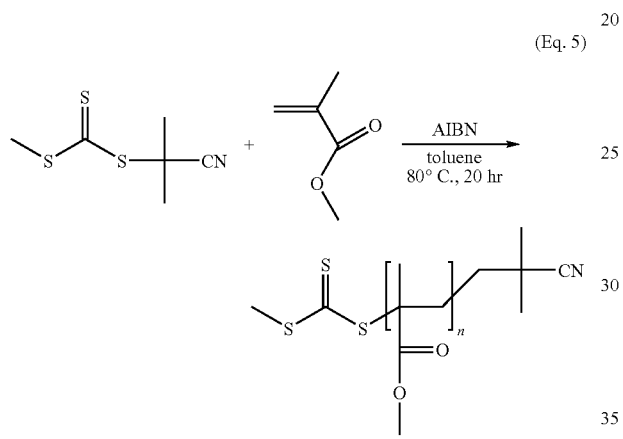

(Eq. 5)

Example 8

Synthesis Au—PMMA Nanoparticles (1) 0.1 g (0.26 mmol) of chloroauric acid ($HAuCl_4 \cdot 3H_2O$) was dissolved in 8 mL of deionized water.

(2) 0.5 g of phase transfer agent tetraoctylamonnium bromide was dissolved in 15 mL of toluene.

(3) The solutions of step (1) and step (2) were charged in a reaction flask and violently stirred for 10 minutes. The water phase was removed and the organic phase was retained. Note that the removed water phase should be transparent. If the water phase is opaque, more toluene should be added by stirring.

(4) 1 g of product in Example 7 was dissolved in 10 mL toluene, added to the organic phase in step (3), and then violently stirred for 5 hours.

(5) 0.12 g (3.12 mmol) of reductant sodium boronhydride ($NaBH_4$) was dissolved in 10 mL of deionized water, added to the mixture in step (4), and then violently stirred for 3 hours. In this step, some bubbles were observed and the upper layered organic phase changed to purple.

(6) After step (5), the upper layered organic phase was extracted and distillated in vacuum to remove most of the solvent.

(7) The crude from step (6) was added to dry methanol to obtain a suspension.

(8) The suspension was centrifugalized at 300 rpm for 15 minutes to obtain the Au—PMMA nanoparticles.

(9) The steps (7) and (8) were performed by alternately deionizing water/dry methanol by three times to wash Au—PMMA, such that the unreacted salt and reactants were removed.

(10) The resulting Au—PMMA from step (9) were dried to obtain a brown solid (0.89 g). The described reaction is shown in Eq. 6.

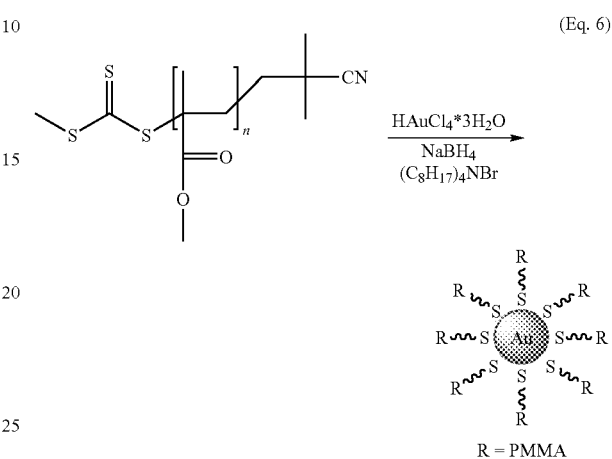

(Eq. 6)

R = PMMA

Example 9

Size Analysis of Au—PMMA

Au—PCm of Example 8 was charged in toluene to form 0.01 wt % suspension, respectively. The suspension was dipped on a copper grid, baked in vacuum to remove toluene, and analyzed by TEM (H-750, Hitachi). The nanoparticles of Example 8 have a size of 4 nm to 6 nm with excellent uniformity.

Example 10

Thermal Analysis of Au—PMMA

Figure 3:
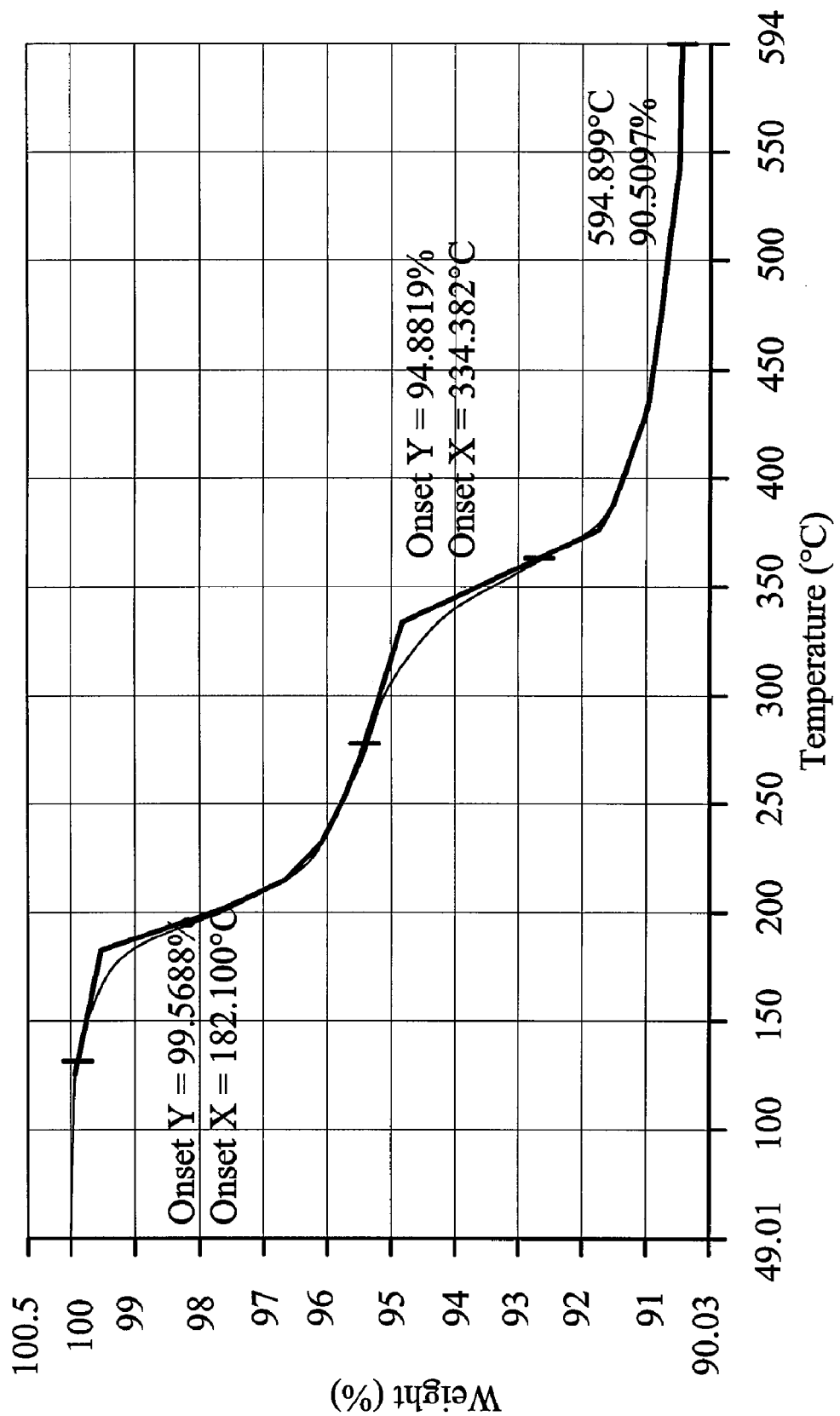
FIG. 3 is a schematic view showing the pyrolysis curve in Example 8 of the invention.

Au—PMMA of Example 8 was charged in a vacuum oven to remove moisture, the dried samples were about 5 mg to 10 mg. The dried samples were charged on platinum plates, heated at rate of 20° C./min under dry nitrogen to analyze the weight loss between 50° C. to 600° C. by thermal gravity analyzer (PERKIN ELMER TGA-4). After combustion, the residue gilt solid was indestructible metal gold. The nanoparticles of Example 8 were pyrolyzed at 182 to 334° C. with two-step pyrolysis, and the residue gold was about 10 wt % of the nanoparticles. FIG. 3 shows the pyrolysis curves of nanoparticles in Example 8.

Example 11

ONVM Device 2-inch glass substrate was subsequently dipped in solvents such as deionized water, acetone, isopropane, cleaned by ultra sonic, and dried. Overlying the glass substrate, a plurality of parallel aluminum layers were formed to be bottom electrodes by evaporation utilizing a photomask with 200/400/800/2000 µm linewidth. The nanoparticles of Example 3 and the polymer of Example 2 were dissolved in toluene. In toluene solution, the nanoparticles had a weight ratio of 0.1 wt % and the polymer had a weight ratio of 0.24 wt %, respectively. The toluene solution was coated on the bottom electrodes and the glass substrate to form a 20-50 nm film by spin-on method (1500 rpm, 60 sec). The film served as the active layer of the ONVM device. At last, a plurality of vertical (related to the direction of the bottom electrodes) aluminum layers were formed to be top electrodes by evaporation. The top and bottom electrodes had a thickness of about 75 nm, thus completing the OVNM device.

Example 12

Endurance Test

Figure 4:
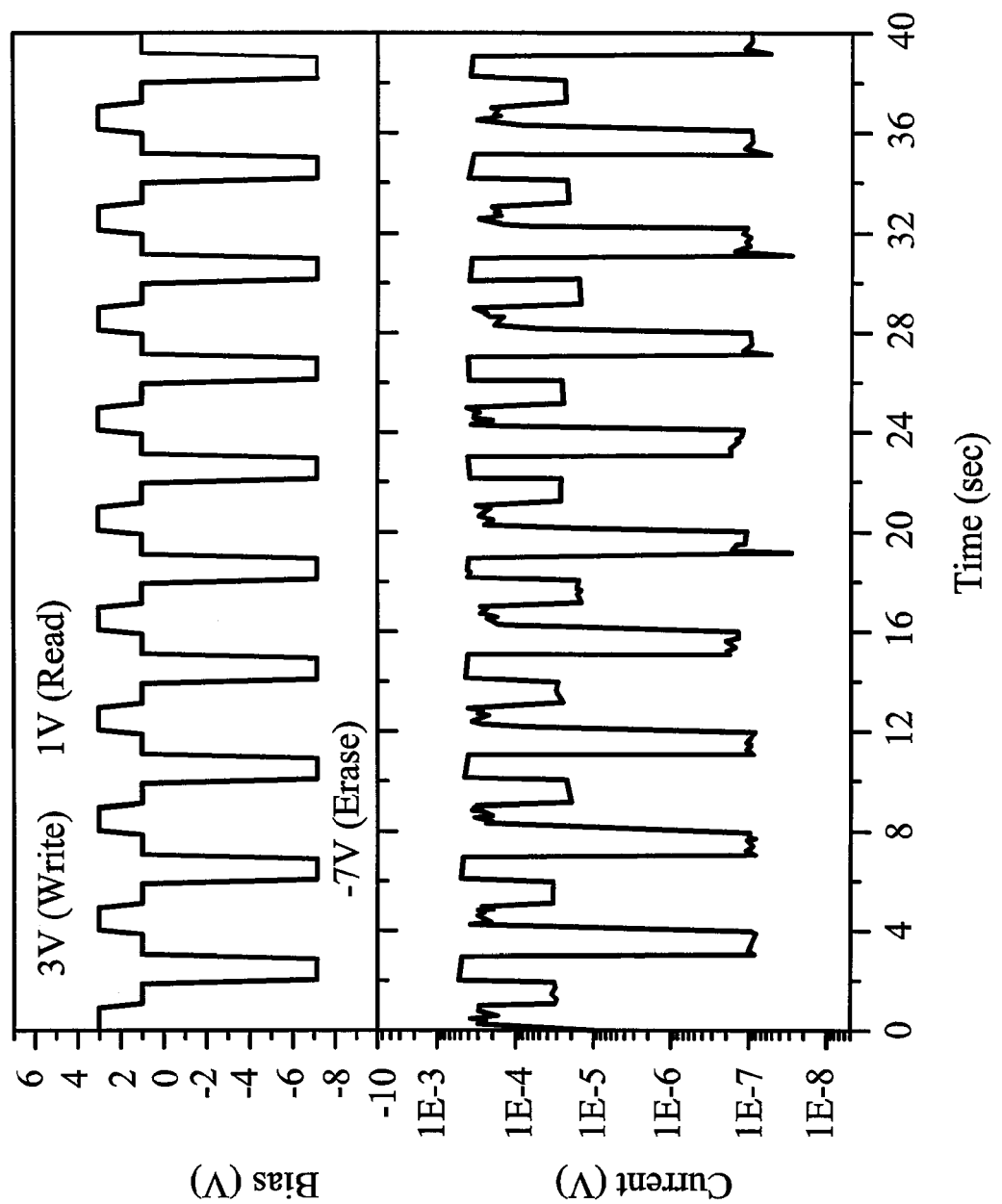
FIG. 4 is a schematic view showing the endurance test of the device in Example 11 of the invention.

FIG. 4 shows the endurance test of the device in Example 11. First, a 3V voltage was applied as "write", and then read by 1V voltage. At this time, the current value was on-state current ($I_{on}$). Subsequently, a −7V voltage was applied as "erase", and then read by 1V voltage. At this time, the current value was off-state current ($I_{off}$). $I_{on}/I_{off}$ means on/off current ratio. Note that the described write-read-erase-read process is a circle and the more circle times means better endurance. For Example 11, the endurance reached 100 circles if $I_{on}/I_{off}$ is $10^3$.

Example 13

Data Retention Time Test

Figure 5:
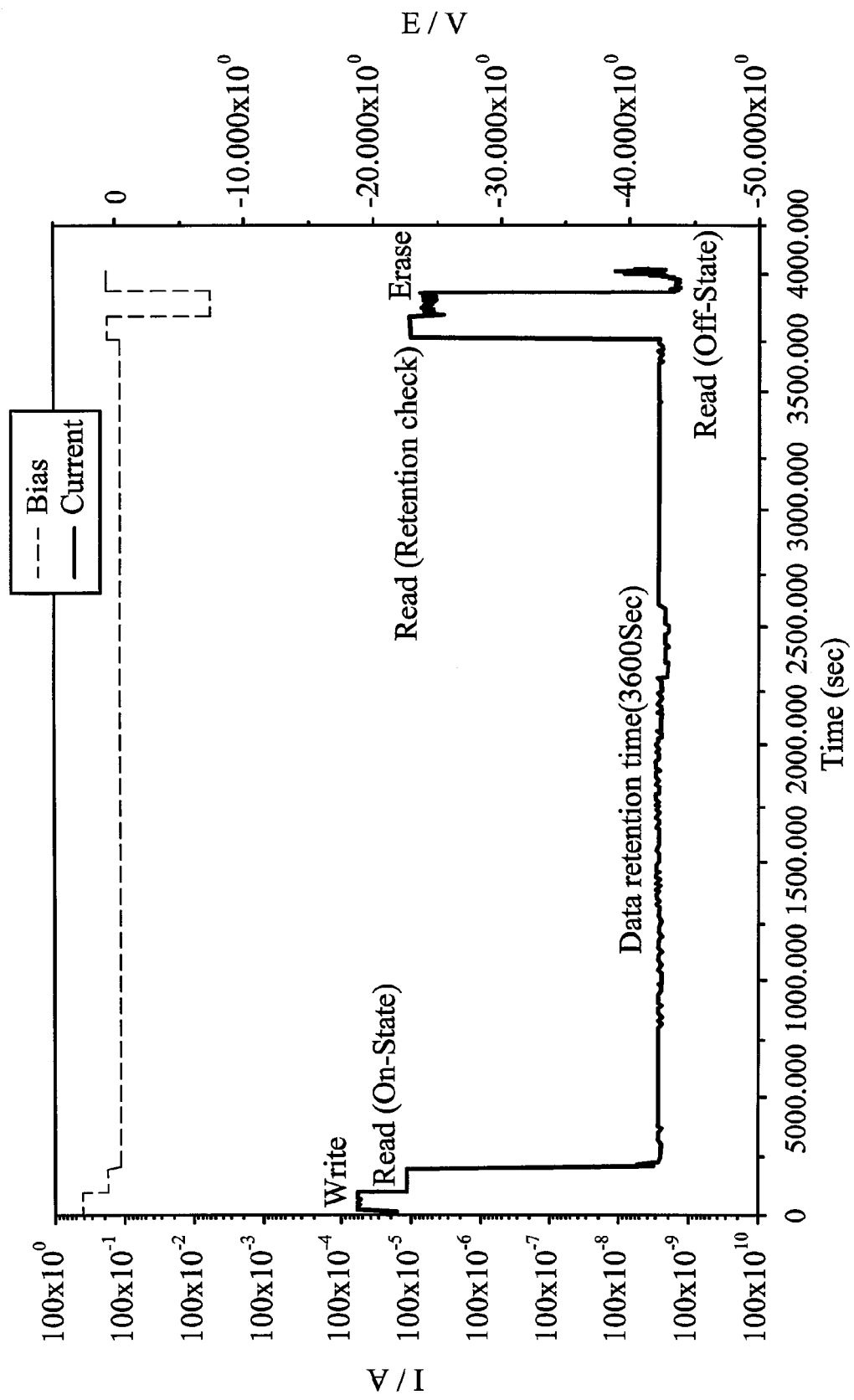
FIG. 5 is a schematic view showing the data retention time test of the device in Example 11 of the invention.

FIG. 5 shows the data retention time test of the device in Example 11. First, a 3V voltage was applied as "write", and then read by 1V voltage. At this time, the current value was on-state current ($I_{on}$). The reverse voltage was not immediately applied, however, the current was only read by 1V voltage. The retention time of the current is a so-called data retention time. At last, −7V voltage was applied as "erase", and then read by 1V voltage to determine the current was off-state current ($I_{off}$). Therefore, a full data retention time test was completed. For Example 11, the data retention time may reach at least 3600 seconds if $I_{on}/I_{off}$ is $10^4$. Note that device performance can be tuned by the factors such as film thickness, mixing ratio of polymer and nanoparticles, and the likes.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic non-volatile memory material, comprising:
   a first polymer; and
   nanoparticles having a metal core covered by a second polymer to form a core/shell structure;
   wherein the first and second polymer are polymerized by a same monomer, and the nanoparticles are evenly dispersed in the first polymer;
   wherein the second polymer comprises poly(2-methyl-acrylic acid-1-adamantan-1-methyl-1-methyl-ethyl ester), poly methylmethacrylate, polypropylene, polycarbonate, polyethylene, polystyrene, or polyethylene terephthalate.

2. The organic non-volatile memory material as claimed in claim 1, wherein the nanoparticles have a size of 1 nm to 100 nm.

3. The organic non-volatile memory material as claimed in claim 1, wherein the nanoparticles have a size of 1 nm to 20 nm.

4. The organic non-volatile memory material as claimed in claim 1, wherein the metal core comprises iron, cobalt, nickel, copper, ruthenium, rhodium, palladium, silver, rhenium, osmium, iridium, platinum, gold, or oxides thereof.

5. The organic non-volatile memory material as claimed in claim 1, wherein the second polymer has a functional terminal end group comprising carboxylic acid, sulfur-containing group, or nitrogen-containing group.

6. The organic non-volatile memory material as claimed in claim 1, wherein the first polymer has a number average molecular weight of 10000 g/mol to 300000 g/mol.

7. The organic non-volatile memory material as claimed in claim 1, wherein the second polymer has a number average molecular weight of 1000 g/mol to 10000 g/mol.

8. The organic non-volatile memory material as claimed in claim 1, wherein the metal core of the nanoparticles and the first polymer have a weight ratio less than 3:1.

9. The organic non-volatile memory material as claimed in claim 1, wherein the metal core of the nanoparticles and the first polymer have a weight ratio less than 0.5:1.

10. A memory device, comprising:
    a power supply electrically connecting to a first electrode;
    a ground wire electrically connecting to a second electrode; and
    an active layer disposed between the first and second electrodes, wherein the active layer is the organic non-volatile memory material as claimed in claim 1.

11. The memory device as claimed in claim 10, wherein the active layer has a thickness less than 2000 nm.

12. The memory device as claimed in claim 10, wherein the active layer has a thickness less than 200 nm.

* * * * *